(12) United States Patent
Kang et al.

(10) Patent No.: US 11,183,372 B2
(45) Date of Patent: *Nov. 23, 2021

(54) BATCH TYPE PLASMA SUBSTRATE PROCESSING APPARATUS

(71) Applicant: EUGENE TECHNOLOGY CO., LTD., Yongin-Si (KR)

(72) Inventors: Sung Ho Kang, Hwaseong-Si (KR); Jeong Hee Jo, Yongin-Si (KR); Gyu Ho Choi, Yongin-Si (KR); Hong Won Lee, Seoul (KR); Chang Dol Kim, Yongin-Si (KR)

(73) Assignee: EUGENE TECHNOLOGY CO., LTD.

( * ) Notice: Subject to any disclaimer, the term of this patent is extended or adjusted under 35 U.S.C. 154(b) by 122 days.

This patent is subject to a terminal disclaimer.

(21) Appl. No.: 16/124,151

(22) Filed: Sep. 6, 2018

(65) Prior Publication Data

US 2019/0108985 A1    Apr. 11, 2019

(30) Foreign Application Priority Data

Oct. 11, 2017   (KR) .................. 10-2017-0129740

(51) Int. Cl.
*H01J 37/32* (2006.01)
*H01L 21/67* (2006.01)
(Continued)

(52) U.S. Cl.
CPC .... *H01J 37/32568* (2013.01); *C23C 16/4587* (2013.01); *C23C 16/50* (2013.01);
(Continued)

(58) Field of Classification Search
CPC ............ H01J 37/32568; H01J 37/3244; H01J 37/32091; H01J 37/32559; H01J 37/32834; H01J 37/32724; H01J 37/32174; H01J 37/32532; H01J 37/32917; H01L 21/67017; C23C 16/4587; C23C 16/50; C23C 16/452; C23C 16/509; C23C 16/45578; C23C 16/401
(Continued)

(56) References Cited

U.S. PATENT DOCUMENTS 5,680,013 A * 10/1997 Dornfest ........... H01J 37/32559
                                                  315/111.21
6,042,686 A *  3/2000 Dible ................ H01J 37/32009
                                                  156/345.44
(Continued)

FOREIGN PATENT DOCUMENTS

CN    101018887 A    8/2007
CN    103930192 A    7/2014
(Continued)

*Primary Examiner* — Ram N Kackar
(74) *Attorney, Agent, or Firm* — Renaissance IP Law Group LLP

(57) ABSTRACT

Provided is a batch-type substrate processing apparatus which supplies, into a processing space, a process gas decomposed in a separate space. The substrate processing apparatus includes: a tube; a substrate support part; a gas supply pipe; an exhaust part; and a plasma reaction part, wherein the plasma part may include a plurality of power supply electrode parts and a ground electrode part.

9 Claims, 4 Drawing Sheets

(51) Int. Cl.
*C23C 16/458* (2006.01)
*C23C 16/50* (2006.01)

(52) U.S. Cl.
CPC .... *H01J 37/3244* (2013.01); *H01J 37/32091* (2013.01); *H01J 37/32559* (2013.01); *H01J 37/32834* (2013.01); *H01L 21/67017* (2013.01)

(58) Field of Classification Search
USPC ............... 118/715; 156/345.33, 345.45
See application file for complete search history.

(56) References Cited

U.S. PATENT DOCUMENTS

| | | | | |
|---|---|---|---|---|
| 7,387,968 | B2* | 6/2008 | Joe | G03F 7/427 134/1.2 |
| 2004/0025786 | A1* | 2/2004 | Kontani | C23C 16/452 118/715 |
| 2007/0048456 | A1* | 3/2007 | Keshner | C23C 16/509 427/569 |
| 2009/0197425 | A1 | 8/2009 | Ishimaru | |
| 2012/0312475 | A1 | 12/2012 | Dhindsa et al. | |
| 2015/0044881 | A1 | 2/2015 | Shimamoto et al. | |
| 2015/0275359 | A1 | 10/2015 | Fukushima et al. | |
| 2016/0284542 | A1* | 9/2016 | Noda | H01L 21/02274 |
| 2018/0182601 | A1* | 6/2018 | Takeda | C23C 16/45542 |

FOREIGN PATENT DOCUMENTS

| | | |
|---|---|---|
| JP | H11243062 A | 9/1999 |
| JP | 2004124234 A | 4/2004 |
| JP | 2006190770 A | 7/2006 |
| JP | 2007266297 A | 10/2007 |
| JP | 2009088565 A | 4/2009 |
| JP | 2010177245 A | 8/2010 |
| JP | 2011135010 A | 7/2011 |
| JP | 2012114340 A | 6/2012 |
| JP | 2013065872 A | 4/2013 |
| JP | 2014056961 A | 3/2014 |
| JP | 2016189419 A | 11/2016 |
| JP | 2018107304 A | 7/2018 |
| JP | 2019057494 A | 4/2019 |
| KR | 100734778 B1 | 7/2007 |
| KR | 20090055349 A | 6/2009 |
| TW | I222677 B | 10/2004 |
| TW | 200731399 A | 8/2007 |
| WO | 2007056369 A2 | 5/2007 |

* cited by examiner

BATCH TYPE PLASMA SUBSTRATE PROCESSING APPARATUS

CROSS-REFERENCE TO RELATED APPLICATION

This application claims priority to Korean Patent Application No. 10-2017-0129740 filed on Oct. 11, 2017 and all the benefits accruing therefrom under 35 U.S.C. § 119, the contents of which are incorporated by reference in their entirety.

BACKGROUND

The present disclosure relates to a batch-type plasma substrate processing apparatus, and more particularly, to a batch-type plasma substrate processing apparatus in which a process gas decomposed in a separate space is supplied into a processing space.

In general, a substrate processing apparatus is an apparatus in which a substrate to be processed is located in a processing space, and then, reaction particles included in a process gas that has been injected into the processing space are deposited on the substrate by means of the chemical vapor deposition method, the atomic layer deposition method, or the like. The substrate processing apparatuses include a single wafer type capable of performing a substrate processing process on a single substrate and a batch type capable of simultaneously performing substrate processing processes on a plurality of substrates.

A general substrate processing apparatus is provided with a heating means so that reaction particles of the process gas that has been injected into a processing space are deposited on a substrate, but has problems caused by a high temperature and a long-time process under a high temperature. In particular, in the case of the batch type, since a plurality of substrates are accommodated in the processing space, the entire substrates cannot be uniformly heated, so that problems of causing a temperature gradient and consuming a long reaction time occur. Accordingly, in order to mitigate the temperature gradient and promote ionization, a chemical reaction, or the like of the processing gas to thereby decrease a reaction temperature and a reaction time in the processing space, plasma is formed.

In order to form plasma, in general, a power electrode to which RF power is applied and a ground electrode are provided, and single RF power is applied to the single power electrode to thereby form plasma between the power electrode and the ground electrode. When a single RF power is applied, while the power for stably forming the plasma or the power for obtaining a required amount of radicals increases, a problem of generating particles occurs. That is, since radicals activated by plasma discharge are affected by the power applied thereto, a high power should be applied to obtain a required amount of radicals. Therefore, when single RF power is applied, high power is applied to obtain a required amount of radicals, so that the ionized particles have high energy, and there is a problem in that a pipe, a tube, or the like for protecting electrodes is damaged and thus particles are generated.

RELATED ART DOCUMENT

Patent Document (Patent document 0001) Korean Patent No. 10-0734778

SUMMARY

The present disclosure provides a batch-type plasma substrate processing apparatus in which a process gas decomposed in a separate space is supplied into a processing space.

In accordance with an exemplary embodiment, a substrate processing apparatus includes: a tube configured to provide a processing space in which a plurality of substrates are processed; a substrate support part configured to load the plurality of substrates in the processing space in a first direction; a gas supply pipe configured to supply, into the tube, a process gas required for a process in which the substrates are processed; an exhaust part configured to communicate with the tube and discharge, to outside, process residues inside the processing space; and a plasma reaction part which extends from the tube, is separated from the processing space by a separation wall configured to define a discharge space in which plasma is formed, and plasma-decomposes the process gas supplied from the gas supply pipe to thereby supply a decomposed process gas to the processing space, wherein the plasma reaction part includes: a plurality of power supply electrode parts accommodated in the discharge space and extending in the first direction; and a ground electrode part provided between the plurality of power supply electrode parts and extending in the first direction.

The plurality of power supply electrode parts and the ground electrode part may be spaced apart from each other and electrically separated, and the plasma may be capacitively coupled plasma (CCP).

The substrate processing apparatus may further include a variable power supply part configured to apply RF power to each of the plurality of power supply parts, and control and supply intensity or ratio of the RF power.

The variable power supply part may include: a power supply part configured to supply the RF power to the plurality of power supply electrode parts; and a plurality of variable capacitors respectively provided between the power supply part and the plurality of power supply electrode parts.

The variable power supply part may further include probing rods which are respectively provided in spaces between the plurality of power supply electrode parts and the ground electrode part and configured to measure a discharge characteristic value, wherein the intensity or ratio of the RF power may be adjusted according to the discharge characteristic value measured by the probing rods.

The substrate processing apparatus may further include a ceramic tube configured to surround outer peripheral surfaces of the plurality of power supply electrode parts and the ground electrode part.

The plurality of power supply electrode parts and the ground electrode part may be disposed to be spaced apart from each other in a peripheral direction of the tube, and the gas supply pipe may extend in the first direction, be provided in plurality, and be provided outside each of the power supply electrode parts.

The gas supply pipes may include: a plurality of supply ports arranged in the first direction, and the supply ports of the gas supply pipes may be formed to face an opposite direction to the power supply electrode parts.

The gas supply pipes may extend in the first direction and be provided in plurality outside a line connecting the power supply electrode parts and the ground electrode part, and the supply ports of the gas supply pipes may be provided to face spaces between the power supply electrode parts and the ground electrode part, respectively.

The plasma reaction part may include a plurality of injection ports arranged in the first direction corresponding to the power supply electrode parts and the substrate support part, and the injection ports and the supply ports may be provided to be misaligned with each other with respect to a radial direction from a central axis of the tube to the supply ports.

The gas supply pipes may include: a reaction gas supply pipe configured to supply a reaction gas to the plasma reaction part; and a source gas supply pipe configured to supply a source gas to the processing space, wherein the plasma reaction part may plasma-decompose the reaction gas.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
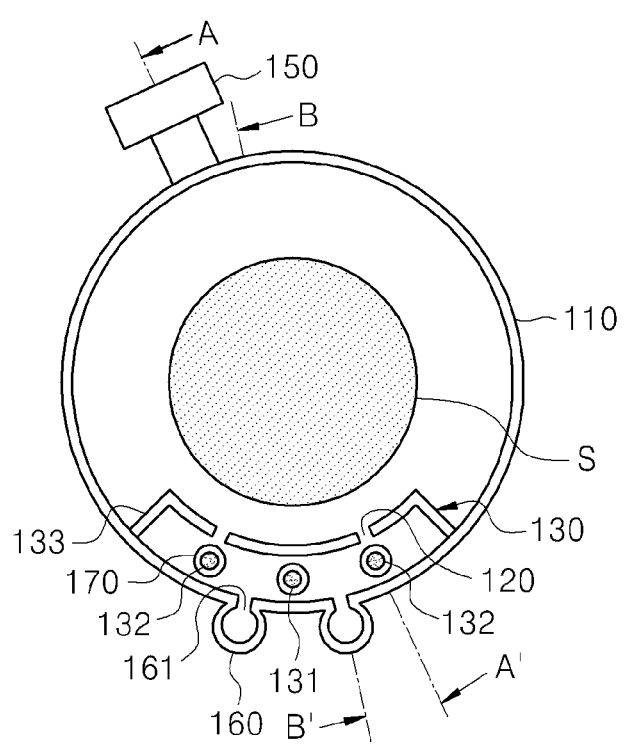
FIG. 1 is a plan view illustrating a substrate processing apparatus in accordance with an exemplary embodiment.

Hereinafter, exemplary embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. The drawings may be exaggerated to describe the present disclosure in detail, and like reference numerals refer to like elements in the drawings.

Figure 2A:
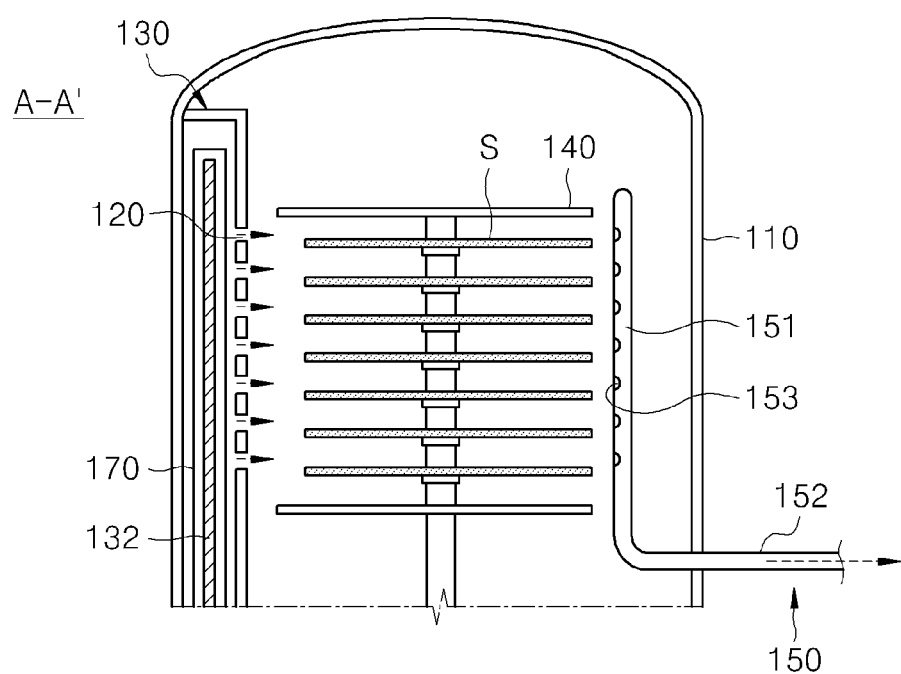
FIG. 2A is a cross-sectional view taken along line A-A' of the plan view in FIG. 1.
Figure 2B:
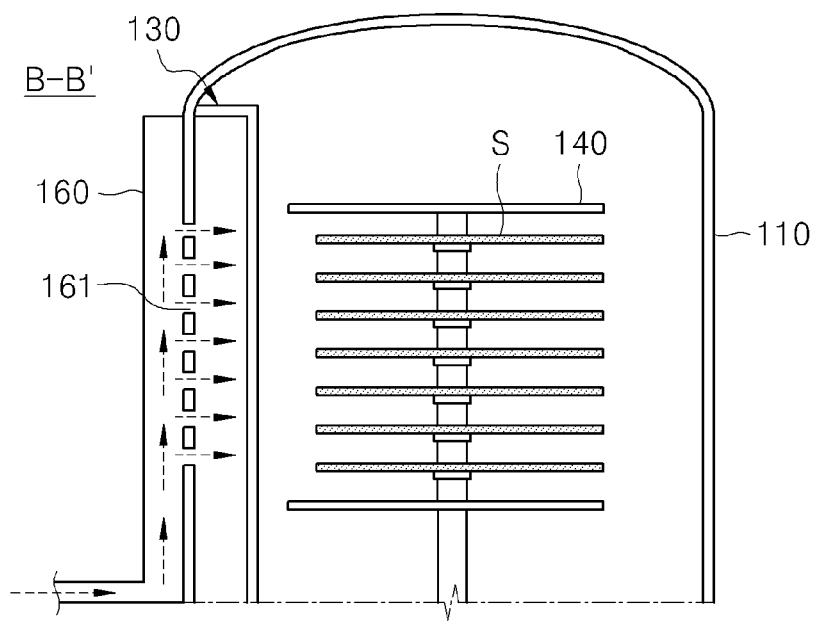
FIG. 2B is a cross-sectional view taken along line B-B' of the plan view in FIG. 1.

FIG. 1 is a plan view illustrating a substrate processing apparatus in accordance with an exemplary embodiment, FIG. 2A is a cross-sectional view taken along line A-A' of the plan view in FIG. 1, and FIG. 2B is a cross-sectional view taken along line B-B' of the plan view in FIG. 1.

Referring to FIGS. 1 and 2, a substrate processing apparatus in accordance with an exemplary embodiment includes: a tube 110 which provides a processing space in which a plurality of substrates S are processed; a substrate support part 140 in which the plurality of substrates S are loaded in a first direction in the processing space; a gas supply pipe 160 for supplying a process gas required for a process in which the substrates S are processed; an exhaust part which communicates with the tube 110 and discharges process residues in the processing space to outside; and a plasma reaction part 130 which extends from the tube 110 and is separated from the processing space by a separation wall that defines a discharge space in which plasma is formed, and which plasma-decomposes the process gas supplied from the gas supply pipe 160 and supplies a decomposed process gas to the processing space, wherein the plasma reaction part 130 may include: a plurality of power supply electrode parts 132 accommodated in the discharge space and extending in the first direction; and a ground electrode part 131 provided between the plurality of power supply electrode parts 132 and extending in the first direction.

First, according to a method for arranging the substrates S in a process to be performed, the substrate processing apparatuses include a single wafer type in which a substrate processing process is performed on a single substrate S, and a batch type in which the substrate processing process is performed on a plurality of substrates S. Here, in the exemplary embodiment, the batch type in which a plurality of substrates S are loaded in the vertical direction (first direction) will be described.

The tube 110 may be formed in a cylindrical shape with an open lower portion and provide therein a processing space in which a plurality of substrates S are accommodated and processed. The processing space of the tube 110 is a region in which an actual process is performed on the substrate support part 140 on which the plurality of substrates S are stacked.

The substrate support part 140 is a component for supporting the substrates S, is formed so that the plurality of substrates S are loaded in the first direction, that is, in the vertical direction, and may have a plurality of unit processing spaces which are formed therein and in which each of the plurality of substrates S is individually processed. That is, the substrate support part 140 may have a plurality of layers so that the substrates S are loaded in the first direction, and a single substrate S may be loaded on a single layer (or the unit processing space). Thus, the unit processing space for a substrate S is individually formed on each layer of the substrate support part 140, and thus, an occurrence of interference between the unit processing spaces may be prevented.

When all of the plurality of substrates are loaded on the substrate support part 140, the substrate support part 140 may move to the processing space of the tube 110 through a lower portion (or entrance) of the tube 110. Here, the substrate support part 140 may have various shapes and structures as long as the plurality of substrates S can be mounted and supported thereon.

The gas supply pipe 160 may supply a process gas required for a process in which the substrates S are processed, and the gas supply pipe 160 may be arranged in the first direction and include a plurality of supply ports 161 formed on different heights from each other.

The plasma reaction part 130 is a component which is separated inside the tube 110 from the processing space by a separation wall 133 that defines a discharge space in which plasma is formed, and which plasma-decomposes the process gas supplied from the gas supply pipe 160 and supplies the decomposed process gas into the processing space. The plasma reaction part 130 extends inward from the inner wall of the tube 110 and may function as an activating mechanism which activates the process gas into plasma and supplies the plasma to the processing space. Here, the plasma reaction part 130 may be disposed inside the tube 110 in the direction in which the plurality of substrates S are vertically loaded. At this point, the plasma reaction part 130 may also be disposed so as to face the exhaust part 150, but the position thereof is not particularly limited.

In addition, a plurality of injection ports 120 which injects the process gas decomposed in the plasma reaction part 130 into the processing space may be formed in the plasma reaction part 130. At this point, the plurality of injection ports 120 may be arranged in the first direction corresponding to respective unit processing space of the substrate support part 140 and be formed in different heights from each other so as to supply the decomposed process gas to the plurality of substrates S, respectively.

The plasma reaction part 130 is provided inside the tube 110, and the discharge space in which plasma is formed is separated from the processing space by the separation wall 133, and thus, the process gas supplied into the tube 110 from the gas supply pipe 160 is not decomposed in the processing space and may be decomposed in the discharge space, which is a separated space, of the plasma reaction part and then supplied to the processing space. Accordingly, the problem may be prevented in which a thin film formed on an inner wall of the processing space by means of a magnetic field or an electric field that are generated due to the formation of plasma in the processing space after the process gas is supplied to the processing space.

The exhaust part 150 may be disposed inside the processing space and function to discharge process residues in the processing space to the outside. The exhaust part 150 may be formed by an exhaust member 151 extending in the first direction; an exhaust line 152 connected to the exhaust member 151, and an exhaust pump (not shown). Here, the exhaust member 151 may be provided with a plurality of exhaust ports 153 which face the injection ports 120 of the plasma reaction part 130 and are formed in the first direction at different heights from each other corresponding to the respective unit processing spaces. Accordingly, the decomposed process gas supplied to the plurality of substrates S through the above-described injection ports 120 of the plasma reaction part 130 may pass through the substrates S and be suctioned to the exhaust ports 153.

As such, the injection ports 120 of the plasma reaction part 130 and the exhaust ports 153 of the exhaust part 150 may be located, corresponding to each other, on the same line in a second direction (for example, a direction parallel to the surfaces of the substrates S) crossing the first direction in which the substrates S are loaded. Therefore, the decomposed process gas injected from the injection ports 120 may form a laminar flow while introduced into the exhaust ports 153. That is, since the decomposed process gas may be introduced into the exhaust ports 153 while moving along the substrates S after contacting the surfaces of the substrates S, the decomposed process gas may flow in the direction parallel to the surfaces of the substrates S and thus be uniformly supplied to the upper surfaces of the substrates S.

Meanwhile, in order to activate the process gas into plasma, in general, single RF power is applied to an electrode to form the plasma. At this point, when single RF power is applied, while the power for stably forming the plasma or the power for obtaining a required amount of radicals increases, a problem of generating particles occurs. That is, since radicals participating in a reaction are affected by the power applied thereto, a high power should be applied to obtain a required amount of radicals. Therefore, when single RF power is applied, high power is applied to obtain a required amount of radicals and the ionized particles thereby have high energy, and there is a problem in that a pipe 170 for protecting electrodes, the separation wall 133, and the tube 110, or the like are damaged, and thus, particle are generated.

In the exemplary embodiment, in the plasma reaction part 130, power is distributed to each of the plurality of power supply electrode parts 132 by using a three-electrode structure which are provided with the plurality of power supply electrode parts 132 and the ground electrode part 131 disposed between the plurality of power supply electrode parts 132. Thus, the power required to generate plasma or the power for obtaining a required amount of radicals is reduced and the occurrence of particles due to high RF power may be prevented.

The power supply electrode parts 132 may receive RF power from a variable power supply part 180 by means of each of the electrodes extending in the first direction in which the substrates S are loaded, and the detailed description about the variable power supply part 180 for applying RF power to each of the power supply electrode parts 132 will be provided later. The ground electrode part 131 may be an electrode extending in the loading direction of the substrates S like the power supply electrode parts 132, and be installed to be spaced apart in parallel from the power supply electrode parts 132 between the plurality of power supply electrode parts 132 so that a plurality of plasma generation spaces are formed between the power supply electrode parts 132 and the ground electrode part 131.

When controlled RF power is applied to each of the above-described power supply electrode parts 132 from the variable power supply part 180, plasma is generated between the power supply electrode parts 132 and the ground electrode part 131. At this point, as in the exemplary embodiment, when the three-electrode structure is provided in which each of the power supply electrode parts 132 are installed outside the ground electrode 131, the RF power required for the generation of plasma for decomposing the process gas or the power required to obtain a required amount of radicals may be reduced to half or remarkably reduced. Thus, the problem, in which the pipe 170 for protecting electrodes, the separation wall 13, the tube 110, or the like is damaged due to the high power and particles are generated, may be prevented. For example, when the RF power required to decompose the process gas with sufficient energy is 100 W, and when the three-electrode structure in which the ground electrode 131 is installed between the plurality of power supply electrode parts 132 is provided, power of 50 W lower than 100 W may be distributed and supplied to each of the power supply electrode parts 132. Thus, even though power lower than the power required to generate plasma is supplied, the same amount of radicals as that in case of supplying power of 100 W may be obtained, and since the low power of 50 W is distributed and supplied to each of the power supply electrode parts 132, the process gas may be more effectively decomposed without generation of particles due to high power.

The plurality of power supply electrode parts 132 and the ground electrode part 131 are spaced apart and electrically separated from each other, and the plasma may be capacitively coupled plasma (CCP).

The power supply electrode parts 132 and the ground electrode part 131 are electrically disconnected and disposed to be spaced apart from each other, and the capacitively coupling plasma (CCP) may be generated by an electric field generated between the power supply electrode parts 132 and the ground electrode part 131 by applying the RF power to each of the power supply electrode parts 132.

Unlike the CCP method in which plasma is formed by obtaining energy by means of electron acceleration generated by an electric field formed between electrically separated electrodes, in the ICP method, plasma is formed from an electric field formed around the magnetic field when the magnetic field formed from current flowing in antennas connected to each other varies. In general, plasma is generated by an E-mode, and high-density plasma is formed while converted to an H-mode. The ICP method is classified into the E-mode and the H-mode according to a plasma density or applied electrical power. In order to achieve conversion from the E-mode having a low plasma density to the H-mode having a high density at which the plasma is maintained, high power should be induced, and when input power increases, there occur problems in that particles and many radicals which do not participate in a reaction due to a high electron temperature are generated, and thus obtaining a good quality film is not easy, and generating a uniform plasma is not easy due to an electric field formed by an antenna.

Conversely, in the exemplary embodiment, since capacitively coupled plasma (CCP) is formed between each of the power supply electrode parts 132 and the ground electrode 131 which are disconnected, electrically separated, and spaced apart from each other, it is not necessary to induce high power to achieve mode conversion as in the inductively coupled plasma (ICP). Therefore, preventing particle generation and obtaining a good film quality by generating many radicals participating in a reaction due to a low electron temperature may be more effectively achieved.

A ceramic tube 170 surrounding the outer peripheral surfaces of the plurality of power supply electrode parts 132 and the ground electrode part 131 may further be provided.

Each of the plurality of power supply electrode parts 132 and the ground electrode part 131 may be protected in a state of being surrounded by the ceramic tube 170 which protects each of the electrode parts from the upper portion to the lower portion thereof, and the plurality of power supply electrode parts 132 and the ground electrode part 131 may be configured from a flexible braided wire.

In general, electricity conduction due to use of RF may be affected by a metal skin depth which is the depth at which current flows. Here, when a mesh-type mesh electrode is used in the plasma reaction part 130 in which RF power is applied and plasma is generated, since the area occupied by a free space is wide, there is a problem in that RF power application is inefficient due to a large resistance caused by a small surface area. Furthermore, the substrate processing process is repeatedly performed at a high temperature and a low temperature. When the electrodes are formed in the mesh type, it is disadvantageous in an aspect of maintaining the shapes that the shapes of the mesh electrodes are irregularly changed according to varying temperatures, and since the resistance varies according to the changed shapes, when the RF power is applied, there is a problem of occurrence of a non-uniform plasma.

Conversely, the plurality of power supply electrode parts 132 and the ground electrode part 131 in accordance with the exemplary embodiment minimize a free space as well as being inserted into the ceramic tube 170, and may be formed in a flexible braided type (braided wire) in order to prevent the above-mentioned problems. In an embodiment, in order to further reduce the free space, a method of coating the surface of each of the electrode parts may also be additionally used.

In addition, a spring part (not shown) may be further provided, which fixes and supports both ends of each electrode part so as to maintain the flexible braided-type power supply electrode parts 132 and the ground part 131 in a state of extending in the first direction and being fixed in a fixed state inside the plasma reaction part 130. By means of the spring part, the flexible power supply electrode parts 132 and the ground part 131 each may be fixed in the first direction and maintained in a thin long rod shape.

The ceramic tube 170 may electrically insulate each of the electrode parts by surrounding the outer peripheral surfaces of the power supply electrode parts 132 and the ground electrode part 131 and protect the electrode parts exposed to a plasma atmosphere from the plasma. Accordingly, the electrode part may be safely protected from contamination or particles which can be caused by the plasma. Like the tube 110, the ceramic tube 170 may be formed of a heat-resistant material such as quartz or ceramic and be integrally formed with the tube 110.

Figure 4:
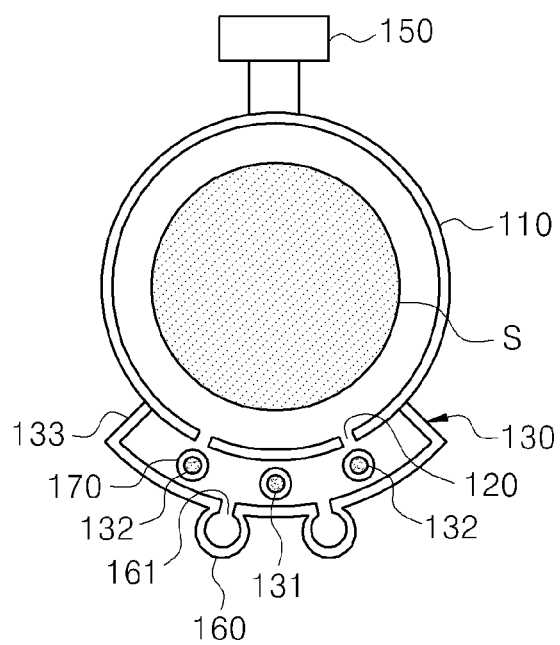
FIG. 4 is a plan view illustrating a substrate processing apparatus in accordance with still another exemplary embodiment.

FIG. 4 is a plan view illustrating a substrate processing apparatus in accordance with still another exemplary embodiment.

As described above, the plasma reaction part 130 including the plurality of power supply electrode parts 132 and the ground electrode part 131 in accordance with still another exemplary embodiment are provided inside the tube 110, and may be separated from the processing space by the separation wall 133 which defines the discharge space in which plasma is formed. Referring to FIG. 4, in accordance with still another exemplary embodiment, a plasma reaction part 130 may be provided outside a tube 110.

A general substrate processing apparatus is provided with a heating means so that reaction particles of the process gas injected into a processing space are deposited on a substrate, but has problems caused by a high temperature and a long-time process under a high temperature. In particular, in the case of the batch type, since a plurality of substrates are accommodated in the processing space, the entire substrates cannot be uniformly heated, so that problems of causing a temperature gradient and consuming a long reaction time occur. Accordingly, in order to mitigate the temperature gradient and promote ionization, a chemical reaction, or the like of the processing gas to thereby decrease the temperature and the time of the reaction in the processing space, plasma is formed in the space inside the processing space. However, a wall surface of the processing space as well as the substrate are heated by a hot wall-type heating means surrounding the processing space, whereby an unwanted thin film is formed while the processing gases are deposited even on the wall surfaces inside the processing space. At this point, when a process atmosphere such as plasma is formed in the processing space, there is a problem in that such a thin film acts as a contaminating substance during the substrate processing process while being detached as particles by means of a magnetic field or an electric filed formed in a plasma generation space. Therefore, problems occur in that not only the quality of the thin film on the substrate, but also the efficiency of the processing process on the substrate is degraded.

Conversely, in still another exemplary embodiment, a plasma reaction part 130 is provided outside a tube 110 and thus, a processing gas may be decomposed in the outside and supplied into a processing space. Therefore, the temperature for decomposing the process gas supplied into the processing space and for depositing the process gas on a substrate S, that is, the heating temperature of a heating means may be decreased. Accordingly, the entirety of the temperatures such as that of wall surfaces of the processing space may be decreased, so that the problem in which an unwanted thin film is deposited on the inner wall of the processing space may be mitigated. In addition, since plasma is formed outside the tube 110, the problem, in which the thin film formed on the inner wall of the processing space is detached as particles by means of a magnetic field or an electric field generated by forming the plasma in the inner space of the processing space after the process gas is supplied to the process space, may be prevented.

Furthermore, the plasma reaction part 130 is disposed outside the tube 110, so that the tube 110 may limit unit processing spaces in which respective substrates S are processed. Therefore, while all the decomposed gases decomposed by the plasma reaction part 130 are injected through injection ports 120 corresponding to respective unit processing spaces and are introduced into the exhaust ports 153 located at the same line, an ideal laminar flow may be formed. In other words, by providing the plasma reaction part 130 to the outside, the tube 110 may restrict, in the processing space, unit processing spaces, in which a plurality of substrates S are loaded and formed. In addition, since the unit processing spaces for the substrates S loaded on respective layers are restricted by an inner wall surface of the processing space and provided separately from each other, the decomposed process gas injected from respective injection ports 120 corresponding to the unit processing spaces may be uniformly and effectively supplied on to the upper surfaces of the substrates without a problem of being wasted, and may form a laminar flow.

Meanwhile, in a still another exemplary embodiment, an outer tube (not shown) which surrounds the outside of a tube 110 so as to form a separation space with the tube 110 may be further provided, and the plasma reaction part 130 may be provided in the separation space. That is, an outer tube which is spaced apart from the tube 110 and surrounds the outside of the tube 110 so that the control of the atmosphere of the plasma reaction part 130 becomes easier may be disposed, and a separation space, which is shielded from an external atmosphere in the atmospheric pressure state, is formed between the outer wall of the tube 110 which is an inner tube and the inner wall of the outer tube, and thus, the plasma reaction part 130 may be formed in the separation space.

The processing space in which the substrates S are processed is in a vacuum state, and the outside of the plasma reaction part provided in the separation space is in the atmospheric pressure state. That is, the processing space of the tube 110, the plasma reaction part 130 provided outside the tube 110, and the outer space of the plasma reaction part 130 are each formed in atmospheres different from each other. Accordingly, the control of an atmosphere suitable for forming plasma, that is, the atmosphere such as the pressure and temperature of the plasma reaction part 130 may be very important. Thus, in still another exemplary embodiment, in order to easily control an atmosphere suitable to generate plasma by more effectively shielding a plasma reaction part 130 from a processing space in a vacuum state and more effectively shielding the plasma reaction part 130 from an external space in the atmospheric pressure state, an outer tube which surrounds a tube 110 from the outside of the tube 110 is disposed to form a separation space (or a buffer space) between the tube 110 and the outer tube, and the plasma reaction part may be provided in an isolated space shielded from the processing space in the vacuum state and the external atmosphere in the atmospheric pressure state, that, is, in the separation space.

In addition, a heating means may be provided to surround the processing space from the outside. At this point, when the plasma reaction part 130 is provided in the separation space which is the space between the tube 110 and the outer tube, it may be easier to install the heating means surrounding the outside or the outer tube. That is, since the plasma reaction part 130 is not formed to protrude from the outside of the tube 110 but formed inside the separation space, the heating means may be installed without being restricted by the plasma reaction part 130.

Referring again to FIG. 1, the gas supply pipes 160 extend in the first direction and are provided outside the line connecting the power supply electrode parts 132 and the ground electrode part 131, and the supply ports 161 of the gas supply pipes 160 may be provided to be directed toward respective spaces between the power supply electrode parts 132 and the ground electrode part 131.

The gas supply pipes 160 may supply the process gas into the plasma reaction part 130 so that the process gas required for the process of processing the substrates S is decomposed in the plasma reaction part 130. When the inside of the plasma reaction part 130 is filled with the process gas received from the plurality of gas supply pipes 160, predetermined RF power is applied to each of the power supply electrode parts 132, and plasma may thereby be generated between the power supply electrode parts 132 and the ground electrode part 131 which face each other, the process gas excited in a plasma state and decomposed may be supplied into the processing space, and thus, the substrate processing process may be performed.

When the plurality of gas supply pipes 160 are provided to the outside from the line connecting the power supply electrode parts 132 and the ground electrode part 131, and when the supply ports 161 of the gas supply pipes 160 are provided to direct toward respective spaces between the power supply electrode parts 132 and the ground electrode part 131, the supply ports 161 of the gas supply pipes 160 may face the spaces between the power supply electrode parts 132 and the ground electrode part 131, respectively, and thus, the decomposition rate of the plasma may be increased. That is, the process gas supplied through the supply ports 161 of the gas supply pipes 160 may be directly supplied to a plasma generation space between the power supply electrode parts 132 and the ground electrode part 131. Accordingly, the time for the process gas for decomposition to be spread into the plasma generation space may be reduced, so that the decomposition speed of the process gas may be improved and the decomposition rate of the plasma may thereby be improved.

In addition, the plurality of gas supply pipes 160 are provided outside the line connecting the power supply electrode parts 132 and the ground electrode part 131, and the supply ports 161 of the gas supply parts 160 are provided to face respective spaces between the power supply electrode parts 132 and the ground electrode part 131, and thus, the size of the space of the plasma reaction part 130 surrounded by the separation wall 133 may be reduced. Therefore, the time for the process gas supplied to the plasma reaction part 130 to be evenly spread may be reduced, and thus, the time for the process gas to be plasma-decomposed and then supplied to the processing space may also be reduced. As illustrated in FIG. 1, the plurality of gas supply pipes 160 are illustrated to protrude from the outer surface of the tube 110 and be respectively provided between the power supply electrode parts 132 and the ground electrode part 131. However, the positions of the gas supply pipes is not particularly limited as long as the positions may be provided between the power supply electrode parts 132 and the ground electrode part 131 and provided outside the line connecting the power supply electrode parts 132 and the ground electrode part 131.

The injection ports 120 and the supply ports 161 may be provided to be misaligned with each other in a radial direction from the central axis of the tube 110 to the supply ports 161.

The injection ports 120 of the above-described plasma reaction part 130 may be formed at different heights from each other in the first direction corresponding to respective unit processing spaces of the substrate support part 140 and at positions corresponding to the respective power supply electrode parts 132 extending in the first direction, and the supply ports 161 of the gas supply pipes 161 may be provided to face the spaces between the power supply electrode parts 132 and the ground electrode part 131, respectively. Accordingly, the injection ports 120 and the supply ports 161 may be misaligned with each other with respect to a radial direction from the central axis of the tube 110 to the supply ports 161. When the positions of the injection ports 120 and the supply ports do not correspond to each other, but are misaligned with each other as illustrated in FIG. 1, the process gas supplied through the supply ports 161 does not immediately escape through the injection ports 111 of the tube 110 but is decomposed after a temporal margin for plasma decomposition and escapes through the injection ports 120. Therefore, the plasma decomposition efficiency may further be improved.

Figure 3:
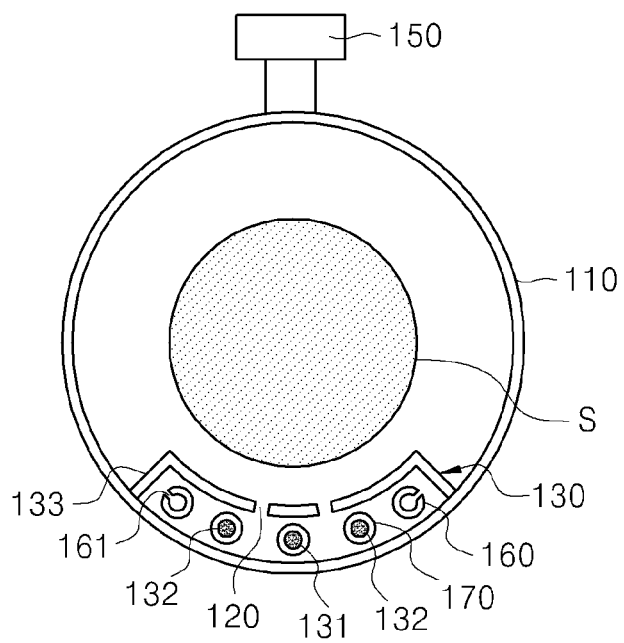
FIG. 3 is a plan view illustrating a substrate processing apparatus in accordance with another exemplary embodiment.

FIG. 3 is a plan view illustrating a substrate processing apparatus in accordance with another exemplary embodiment.

Referring to FIG. 3, in a still another exemplary embodiment, a plurality of power supply electrode parts 132 and a ground electrode part 131 are disposed to be spaced apart from each other in the peripheral direction of a tube 110, and a plurality of gas supply pipes 160 may be provided to extend in the first direction and may thereby be provided outside the respective power supply electrode parts 132.

Like the plurality of power supply electrode parts 132 and the ground electrode part 131, the gas supply pipes 160, which extend in the first direction, are provided outside the power supply electrode parts 132, which are disposed in a separation wall 133 to be spaced apart from each other in the peripheral direction of the tube 110, so that the process gas required for the process in which substrates S are processed may be decomposed in a plasma reaction part 130. Thus, the gas supply pipes 160 may supply the process gas into the plasma reaction part 130.

When the inside of the plasma reaction part 130 is filled with the process gas supplied from the plurality of gas supply pipes 160, the process gas may be plasma-decomposed by applying predetermined RF power to the respective power supply electrode parts 132, and the decomposed process gas may be supplied into the processing space, and thus, a substrate processing process may be performed.

Here, the supply ports 161 of the gas supply pipes 160 may be formed to face the direction opposed to the power supply electrode parts 132.

When the supply ports 161 of the gas supply pipes 160 provided outside the respective power supply electrode parts 132 are provided to face the separation wall 133, the process gas supplied from the supply ports 161 may be gradually spread to the central region of the plasma reaction part 130 from the separation wall 133 facing the supply ports 161. Thus, the process gas may be distributed uniformly in the entire space inside the plasma reaction part 130, and the entire process gas may thereby be plasma-decomposed and provided to the processing space.

Unlike the exemplary embodiment, when the supply ports 161 of the gas supply pipes 160 provided outside the respective power supply electrode parts 132 are not formed at positions facing the separation wall 133, but conversely formed at positions facing the power supply electrode parts 132, the process gas is spread into the plasma reaction part 130 and may immediately escape to the processing space through the injection ports 120 of the tube 110 without a temporal margin for being decomposed with plasma. Therefore, not only the process gas may be wasted, but also the process efficiency may thereby be degraded.

Conversely, in the exemplary embodiment, since the supply ports 161 of the gas supply pipes 160 are formed at positions facing the separation wall 133, the process gas does not immediately escape to the processing space through the injection ports 120, but may be uniformly spread and filled from an edge region of the plasma reaction part 130 (that is, the separation wall facing the supply ports 161) to the central region. Accordingly, a temporal margin during which the process gas stays inside the plasma reaction part 130 is increased, and thus, the plasma decomposition efficiency of the process gas may be improved.

Figure 5:
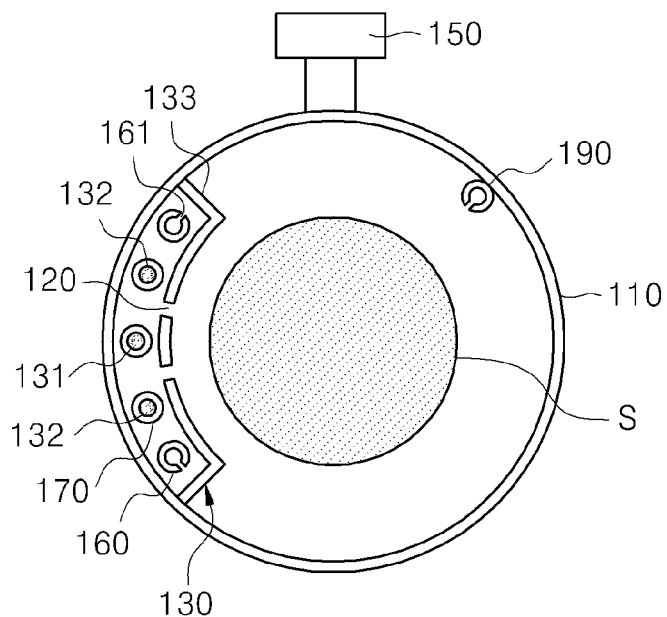
FIG. 5 is a plan view illustrating a gas supply pipe in accordance with an exemplary embodiment.

FIG. 5 is a plan view illustrating a gas supply pipe in accordance with an exemplary embodiment.

Referring to FIG. 5, gas supply pipes 160 includes: a reaction gas supply pipe 160 which supplies a plasma reaction part 130 with a reaction gas; and a source gas supply pipe 190 which supplies a processing space with a source gas, wherein the plasma reaction part 130 may plasma decompose the reaction gas.

The process gas may include one or more kinds of gas, that is, the reaction gas and the source gas, and the source gas supply pipe 190 may supply the source gas directly to the processing space. The source gas may be composed of a gas (dichlorosilane (SiH$_2$Cl$_2$, abbreviation: DCS etc.) which contains a thin film material such as silicone including a thin-film material to be deposited on to substrates S.

Unlike the source gas supply pipe 190 which supplies the source gas directly to the processing space, the reaction gas supply pipe 160 may firstly supply a reaction gas into the plasma reaction part 130, and the reaction gas may be activated by plasma and provided into the processing space. Such a reaction gas may be composed of a nitrogen-containing gas (nitrogen-containing gas), such as NH$_3$, N$_2$O, and NO, which reacts with the source gas to form a thin-film layer.

In accordance with an exemplary embodiment, by supplying the plasma reaction part 130 with a reaction gas such as NH$_3$, N$_2$O, and NO, which has a higher gas decomposition temperature than the source gas which is decomposed even at a low temperature, the reaction gas is effectively decomposed by the plasma reaction part 130 and then may be provided to the processing space. Since details of plasma-decomposing of the reaction gas are the same as those described above with reference to FIGS. 1 to 4, detailed description thereof will not be provided herein.

Figure 6A:
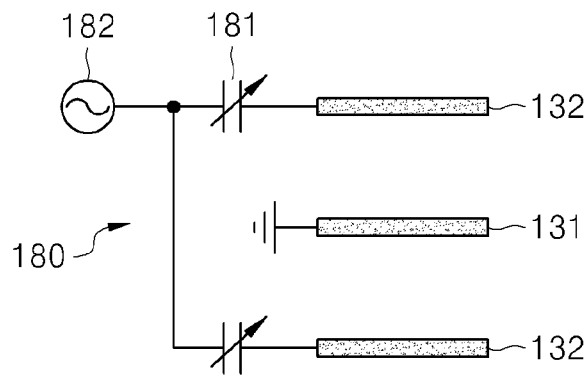
FIGS. 6A-6B are circuit diagrams illustrating a variable power supply part in accordance with some embodiments.
Figure 6B:
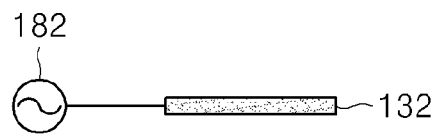
Figure 6B:
Figure 6B:

FIGS. 6A-6B are circuit diagrams illustrating a variable power supply part in accordance with some embodiments.

Referring to FIGS. 6A-6B, the substrate processing apparatus may further include a variable power supply part 180 which applies RF power to each of a plurality of power supply electrode parts 132, and control and supply intensity or ratio of the RF power.

Plasma generation spaces are spaces which are respectively formed between the plurality of power supply electrode parts and a ground electrode part 131, and the shapes, the widths, and the like of the plasma generation spaces play an important role in the plasma generation and the density determination. Here, although the widths of the plasma generation spaces which are respectively formed between the plurality of power supply electrode parts 132 and the ground electrode part 131 are formed to have the same width, there is a problem in that the generation of plasma may become non-uniform due to various external factors. That is, although the plurality of power supply electrode parts 132 and the ground electrode part 131 are disposed to be spaced a certain distance apart from each other and a plurality of plasma generation spaces having the same width are formed, the plasma density distribution during the plasma generation are not accurately made into 1:1, and thus, a problem occurs in that the density distribution becomes non-uniform.

In the exemplary embodiment, the intensity or ratio of the RF power source applied to each of the power supply electrode parts 132 may be adjusted by using the variable power supply part 180 so that uniform plasma is generated in each of the plasma generation spaces.

The variable power supply part 180 may include: a powers supply part 182 which supplies RF power to the plurality of power supply electrode parts 132; and a plurality of variable capacitors 181 which are provided respectively between the power supply part 182 and the plurality of power supply electrode parts 132.

The power supply part 182 supplies RF power to each of the power supply electrode parts 132, and in an embodiment, as illustrated in FIG. 6A, the power supply parts 182 may be electrically connected to the respective power supply electrode parts 132 and may also independently supply the RF power applied to the respective power supply electrode parts 132. In addition, in another embodiment, as illustrated in FIG. 6A, the RF power output from a single power supply part 182 may also be distributed and supplied to a plurality of variable capacitors 181 and the power supply electrode parts 132.

The variable capacitor 181 may be provided in plurality, and the plurality of variable capacitors 181 may be respectively disposed corresponding to the plurality of power supply electrode parts 132, and may respectively be connected between a distribution point at which the RF power source supplied from the output part of the power supply part 182 is distributed and the plurality of power supply electrode parts 132. In addition, the variable capacitors 181 may adjust the intensity or ratio of the RF power supplied from the power supply parts 182 electrically connected to the variable capacitors.

The variable power supply parts 180 may further include probing rods which are respectively provided in the spaces between the plurality of power supply electrode parts 132 and the ground electrode part 131 to measure a discharge characteristic value of the plasma, and the intensity and ratio of the RF power may be adjusted by using the discharge characteristic value measured by the probing rods.

The probing rods may be provided to the respective spaces of the plurality of power supply electrode parts 132 and the ground electrode part 131 so that the intensity or ratio of the RF power may be adjusted by the variable capacitors 181. At this point, the discharge characteristic value, that is, a discharge current, a discharge voltage, a phase and the like, of the plasma formed in the plasma generation space are measured by the probing rods, and thus, the intensity or ratio of the RF power may be adjusted.

In accordance with exemplary embodiments, the intensity or ratio of the RF power applied to each of the power supply electrode parts 132 is controlled and the deposition of radicals required for the substrate S processing process may be variably adjusted to be uniform. Thus, the problem in which the plasma density distribution becomes non-uniform may be solved.

In an exemplary embodiment, a plasma reaction part which is a separate space separated from a processing space is provided, and thus, a process gas supplied from a gas supply pipe may be decomposed in the plasma reaction part and then be supplied into the processing space. Accordingly, not only the problem in which particles are detached from the inner wall of the processing space may be prevented, but also the efficiency of a substrate processing process may be improved.

In addition, a three-electrode structure in which power supply electrode parts are installed outside a ground electrode part is provided, so that RF power required to stably form plasma or to obtain a required amount of radicals may be distributed and supplied to the plurality of power supply electrode parts. Accordingly, the power supplied to the power supply electrode parts may be greatly reduced, and thus, generation of particles due to high RF power may be prevented.

In addition, since capacity coupled plasma (CCP) is formed between the power supply electrode parts and the ground electrode part which are disposed to be spaced from each other, a stable plasma may be formed even with a lower power than that of inductively coupled plasma (ICP). Also, since many radicals participating in a reaction are generated due to a low electron temperature, a good quality film may be effectively obtained.

Furthermore, the intensity or ratio of the RF power applied to each of the power supply electrode parts is adjusted by using a variable power supply part, whereby plasma may be uniformly generated in each of the plasma generation spaces.

So far, in the detailed description of the present disclosure, specific exemplary embodiments have been described, but various modifications can be made thereto without departing from the spirit and scope of the present disclosure. Therefore, the scope of the invention is defined not by the detailed description of the invention but by the appended claims, and all differences within the scope will be construed as being included in the present invention.

What is claimed is:

1. A substrate processing apparatus comprising:
   a tube configured to provide a processing space in which a plurality of substrates are processed;
   a substrate support part configured to load the plurality of substrates in the processing space in a first direction;
   a plurality of gas supply pipes configured to supply, into the tube, a process gas required for a process in which the substrates are processed;
   an exhaust part configured to communicate with the tube and discharge, to outside, process residues inside the processing space; and
   a plasma reaction part which extends from a surface of the tube, is separated from the processing space by a separation wall configured to define a discharge space in which plasma is formed, and plasma-decomposes the process gas supplied from the gas supply pipe to thereby supply a decomposed process gas to the processing space,
   wherein the plasma reaction part comprises:
   a plurality of power supply electrode parts accommodated in the discharge space and extending in the first direction; and a ground electrode part provided between the plurality of power supply electrode parts, wherein the ground electrode part is spaced apart from each of plurality of power supply electrode parts and extends in the first direction, wherein each space between each of the plurality of power supply electrode parts and the ground electrode part forms a plurality of plasma generation spaces, wherein the substrate processing apparatus further comprises a variable power supply part configured to apply a RF power to each of the plurality of power supply electrode parts, by controlling an intensity or a ratio of the RF power applied to each of the plurality of power supply electrode parts so that a plasma density of each of the plurality of plasma generation spaces is uniform, wherein the variable power supply part comprises:

a power supply part configured to supply the RF power to the plurality of power supply electrode parts; and a variable capacitor provided between a distribution point at which the RF power supplied from the power supply part is distributed and one of the power supply electrode parts, wherein the plurality of gas supply pipes include a plurality of supply ports within the plasma reaction part, and are arranged symmetrically at opposite sides of a line extending in a radius direction from a central axis of the tube to the ground electrode part.

2. The substrate processing apparatus of claim 1, wherein the plurality of power supply electrode parts and the ground electrode part are spaced apart from each other and electrically separated, and the plasma is capacitively coupled plasma (CCP).

3. The substrate processing apparatus of claim 1, wherein the variable power supply part further comprises probing rods which are respectively provided in spaces between the plurality of power supply electrode parts and the ground electrode part and configured to measure a discharge characteristic value of the plasma, and the intensity or ratio of the RF power is adjusted according to the discharge characteristic value measured by the probing rods.

4. The substrate processing apparatus of claim 1, further comprising a ceramic tube configured to surround outer peripheral surfaces of the plurality of power supply electrode parts and the ground electrode part.

5. The substrate processing apparatus of claim 1, wherein the plurality of power supply electrode parts and the ground electrode part are disposed to be spaced apart from each other in a peripheral direction of the tube, and the plurality of gas supply pipes extend in the first direction and are respectively provided outside each of the power supply electrode parts in a peripheral direction of the tube.

6. The substrate processing apparatus of claim 5, wherein the plurality of supply ports are arranged in the first direction, and the supply ports of each of the plurality of gas supply pipes are formed to face an opposite direction to the power supply electrode parts.

7. The substrate processing apparatus of claim 1, wherein the plurality of gas supply pipes are respectively provided corresponding to the plurality of plasma generation spaces outside a line connecting the power supply electrode parts and the ground electrode part, the plurality of gas supply pipes extend in the first direction and the plurality of supply ports are arranged in the first direction, and the supply ports of each of the plurality of gas supply pipes are provided to face a corresponding plasma generation space.

8. The substrate processing apparatus of claim 7, wherein the plasma reaction part comprises a plurality of injection ports arranged in the first direction corresponding to the power supply electrode parts and the substrate support part, and the injection ports and the supply ports are provided to be misaligned with each other with respect to a radial direction from a central axis of the tube to the supply ports.

9. The substrate processing apparatus of claim 1, wherein the plurality of gas supply pipes comprise:

a reaction gas supply pipe configured to supply a reaction gas to the plasma reaction part; and a source gas supply pipe configured to supply a source gas to the processing space, wherein the plasma reaction part plasma-decomposes the reaction gas.

* * * * *